United States Patent
Mitzlaff et al.

(10) Patent No.: US 7,634,240 B2
(45) Date of Patent: Dec. 15, 2009

(54) METHOD AND APPARATUS FOR CONTROLLING A SUPPLY VOLTAGE TO A POWER AMPLIFIER

(75) Inventors: James E. Mitzlaff, Arlington Heights, IL (US); Patrick C. Mathes, McHenry, IL (US); Rodney Hagen, Lake in the Hills, IL (US)

(73) Assignee: Motorola, Inc., Schaumburg, IL (US)

( * ) Notice: Subject to any disclaimer, the term of this patent is extended or adjusted under 35 U.S.C. 154(b) by 509 days.

(21) Appl. No.: 11/345,006

(22) Filed: Jan. 31, 2006

(65) Prior Publication Data

US 2007/0178856 A1   Aug. 2, 2007

(51) Int. Cl.
*H04B 1/04* (2006.01)

(52) U.S. Cl. .............. 455/127.3; 455/115.3; 455/127.5

(58) Field of Classification Search .............. 455/115.1, 455/115.2, 115.3, 115.4, 127.1, 127.3, 127.5
See application file for complete search history.

(56) References Cited

U.S. PATENT DOCUMENTS

| | | | |
|---|---|---|---|
| 5,638,403 A * | 6/1997 | Birchler et al. ............. 375/296 |
| 6,160,449 A * | 12/2000 | Klomsdorf et al. .......... 330/149 |
| 6,166,598 A * | 12/2000 | Schlueter .................... 330/127 |
| 6,353,359 B1 | 3/2002 | Leizerovich |
| 6,798,843 B1 | 9/2004 | Wright |
| 6,985,039 B2 | 1/2006 | Bar-David |
| 2002/0008577 A1 * | 1/2002 | Cova et al. .................... 330/52 |
| 2002/0159427 A1 * | 10/2002 | Cleveland ................... 370/342 |
| 2002/0171481 A1 | 11/2002 | Sasho |
| 2003/0045238 A1 | 3/2003 | Leizerovich et al. |
| 2004/0076247 A1 * | 4/2004 | Barak et al. ................. 375/350 |
| 2004/0127173 A1 | 7/2004 | Leizerovich |
| 2005/0046507 A1 | 3/2005 | Dent |
| 2005/0242875 A1 | 11/2005 | Gurvich |

OTHER PUBLICATIONS

Wright, Andrew S., and Durtler, Willem G., "Experimental Performance of an Adaptive Digital Linearized Power Amplifier", IEEE Transactions on Vehicular Technology, vol. 41, No. 4, Nov. 1992.

Stapleton, Shawn, "Amplifier Linearization Using Adaptive Digital Predistortion", Agilent Technologies, Applied Microwave & Wireless, Feb. 2001.

* cited by examiner

*Primary Examiner*—Nhan T Le
(74) *Attorney, Agent, or Firm*—Valerie M. Davis

(57) ABSTRACT

A supply voltage to a power amplifier is controlled. A signal at a single point in a power amplifier is detected. A signal parameter is determined for the detected signal. The signal parameter is compared to at least one predetermined limit. This comparison result is used to determine whether to adjust a supply voltage to the power amplifier. The signal parameter is, for example, an average power or a peak-to-average power ratio.

12 Claims, 5 Drawing Sheets

METHOD AND APPARATUS FOR CONTROLLING A SUPPLY VOLTAGE TO A POWER AMPLIFIER

FIELD OF THE INVENTION

The invention generally relates to transmitters, and in particular, to controlling a supply voltage to a power amplifier of a transmitter.

BACKGROUND OF THE INVENTION

A transmitter, such as a radio frequency transmitter used for communications, includes a power amplifier. It is known that a power supply to the power amplifier may be modulated to improve efficiency. In particular a peak voltage of the power supply is changed according to the peak voltage amplitude of the signal from the power amplifier, or an envelope tracking scheme is used to modulate the power supply voltage to the power amplifier according to the input to the power amplifier.

One problem with modulating or changing the power supply voltage to a power amplifier is that unwanted distortion may occur due to gain compression caused by excessive power supply voltage reduction. This may result in clipping the output signal from the power amplifier. Therefore, it is desirable to detect power amplifier compression and adjust the power supply voltage to the power amplifier accordingly. In one solution for detecting and adjusting for power amplifier compression, two signals are detected for use in determining power amplifier compression. These two signals are typically from two different points in the power amplifier. For example, the two signals are an input to the power amplifier and an output from the power amplifier, or a raw signal and a corrected signal that results by adding feedback to the raw signal. A compression detector senses the state of the two signals and generates a compression feedback signal. The feedback signal indicates whether there is deviation from an optimum compression level. Where there is undesirable deviation, a power supply modulator adjusts the supply voltage to the power amplifier. This algorithm for compression detection may be relatively computation intensive, which is not a problem for many applications. In some instances though, where compression detection is desired, there may not be access to two signals from different points in power amplification or there may be limited computation resources.

Therefore a need exists for improved compression detection for controlling a supply voltage to a power amplifier.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with embodiments of the present invention.

DESCRIPTION OF EMBODIMENTS OF THE INVENTION

Figure 1:
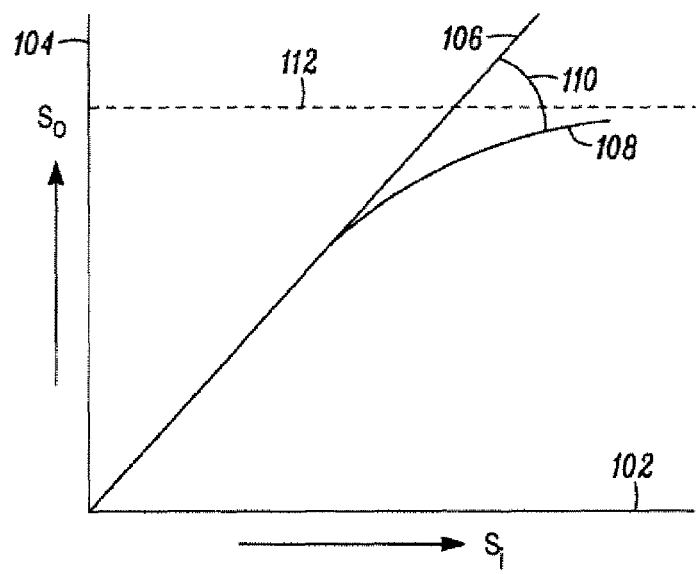
FIG. 1 is a graph of linear amplifier operation versus ideal operation.

Before describing in detail embodiments that are in accordance with the present invention, it should be observed that the embodiments reside primarily in combinations of method steps and apparatus components related to a method and apparatus for controlling a supply voltage to a power amplifier. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein. Thus, it will be appreciated that for simplicity and clarity of illustration, common and well-understood elements that are useful or necessary in a commercially feasible embodiment may not be depicted in order to facilitate a less obstructed view of these various embodiments.

It will be appreciated that embodiments of the invention described herein may be comprised of one or more conventional processors and unique stored program instructions that control the one or more processors to implement, in conjunction with certain non-processor circuits, some, most, or all of the functions of the method and apparatus for controlling a supply voltage to a power amplifier described herein. The non-processor circuits may include, but are not limited to, a radio transmitter, signal drivers, clock circuits, power source circuits, amplifiers and user input devices. As such, these functions may be interpreted as steps of a method to control a supply voltage to a power amplifier described herein. Alternatively, some or all functions could be implemented by a state machine that has no stored program instructions, or in one or more application specific integrated circuits (ASICs), in which each function or some combinations of certain of the functions are implemented as custom logic. Of course, a combination of these approaches could be used. Thus, methods and means for these functions are described herein. Further, it is expected that one of ordinary skill, notwithstanding some effort and many design choices motivated by, for example, available time, current technology, and economic considerations, when guided by the concepts and principles disclosed herein will be readily capable of generating such software instructions and programs and integrated circuits with minimal experimentation.

A method for controlling a supply voltage to a power amplifier in accordance with one aspect of the invention includes detecting a signal at a single point in a power amplifier to produce a detected signal. A signal parameter is determined for the detected signal. The signal parameter is compared to at least one predetermined limit. This comparison result is used to determine whether to adjust a supply voltage to the power amplifier. The signal parameter is, for example, an average power or a peak-to-average power ratio.

An apparatus for controlling a supply voltage to a power amplifier in accordance with another aspect of the invention includes a processor that executes instructions to detect a signal at a single point in a power amplifier to produce a detected signal. The processor then determines a signal parameter based on the detected signal. The signal parameter is compared to at least one predetermined limit to generate a comparison result. The comparison result is used to determine whether to adjust a supply voltage to the power amplifier. The signal parameter is, for example, an average power or a peak-to-average power ratio.

FIG. 1 shows a graph chart 100 which illustrates the effect of amplifier compression. The graph shows the signal strength at the input of the transmitter, $S_i$ 102 versus an output signal $S_o$ 104. In an ideal linear amplifier the relationship is a straight line 106. However, as the output voltage approaches a limiting voltage 112 (that is proportional to a supply voltage), the output deviates from the ideal, as illustrated by line 108. As the difference between the ideal and the actual begins increasing, as at 110, the resulting distortion causes an undesirable amount of out-of-band emissions and information loss. Generally, an amount of compression exceeding 1 decibel (dB) is considered excessive. In accordance with an embodiment of the present invention the compression level is optimized by maintaining a desired amount of compression. By maintaining a desired amount of compression, the radio frequency power amplifier (RFPA) operates at peak efficiency while excess distortion is avoided.

Figure 2:
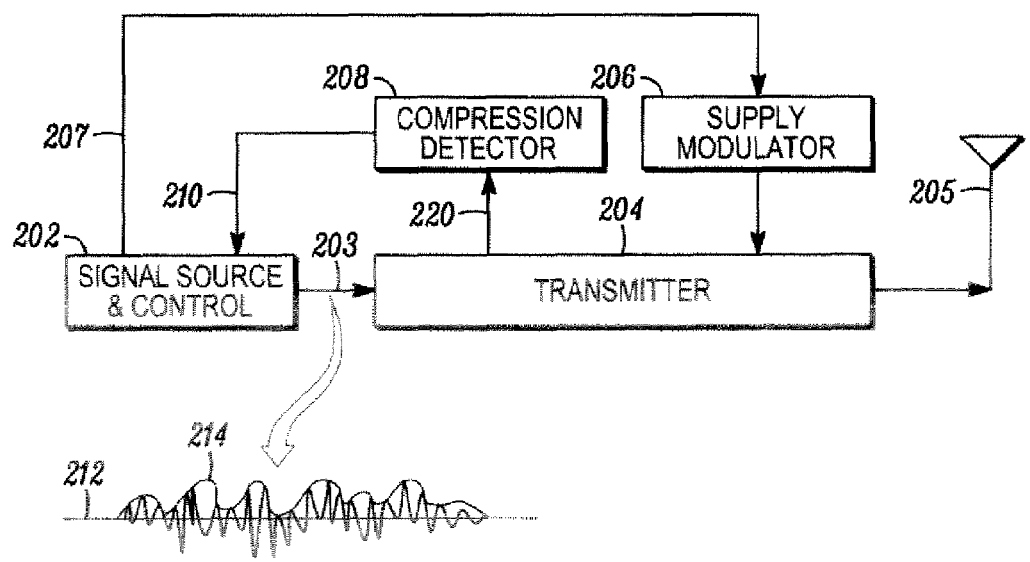
FIG. 2 is a general block diagram of a transmitter in accordance with an embodiment of the present invention.

Referring now to FIG. 2, there is shown a block diagram 200 of a general transmitter including a means for detecting compression in accordance with an embodiment of the present invention. A signal source and control block 202 includes control means for acquiring and processing a signal, such as a voice or digital signal in a mobile communication device. The signal source provides a signal or signals, such as baseband quadrature I and Q signals, to be transmitted on line 203 to the transmitter 204. The transmitter provides modulation, filtering, and radio frequency (RF) power amplification, and provides a modulated RF signal to an antenna 205. To increase the efficiency of the RF power amplifier in the transmitter, a supply modulator 206 provides and controls the power supplied to the RFPA component of the transmitter. In one embodiment, the supply modulator controls the voltage level provided to the RFPA to maintain efficiency as the input signal varies in amplitude. The supply modulator may be responsive to an envelope modulation signal on line 207 that is supplied by the signal source and control block 202. The supply modulator adjusts its output level according to the modulation signal.

In one embodiment, to generate the envelope modulation signal provided to the supply modulator 206, the signal source and control means evaluates the signal to be transmitted 212, and determines an envelope 214 of the signal. The envelope that is determined may not be a precise duplication of the actual envelope of the signal, and only needs to substantially correspond to the actual envelope. For example the envelope that is determined may be a band limited envelope. The envelope modulation signal substantially tracks the envelope 214. The envelope may be determined via either analog or digital means, as is known in the art. However, occasionally a signal condition may arise such that, even though the supply level is modulated in correspondence with the envelope of the signal, due to variations in the design over temperature, or because of component variations in manufacturing, an excess compression condition will still occur and distort the signal, causing out-of-band emissions and information loss, if left uncorrected. To avoid such a situation, the compression detector 208 detects this condition, sends the appropriate signal to the signal source and control block 202 on a line 210, and the signal source and control block adjusts the peak voltage of the envelope modulation signal 207, causing the supply modulator to adjust the voltage level supplied to the RFPA, thus maintaining the desired optimum compression level. More specifically, compression detector 208 receives or detects a signal via line 220, wherein the location in the transmission path where this detection occurs is based in part on the transmitter topology as illustrated by reference to FIGS. 3-5. Then a signal parameter is determined for the detected signal. The signal parameter is compared to at least one predetermined limit to generate a comparison result. The comparison result is used to determine whether to adjust the supply voltage to the power amplifier. The signal parameter is, for example, an average power or a peak-to-average power ratio.

Figure 3:
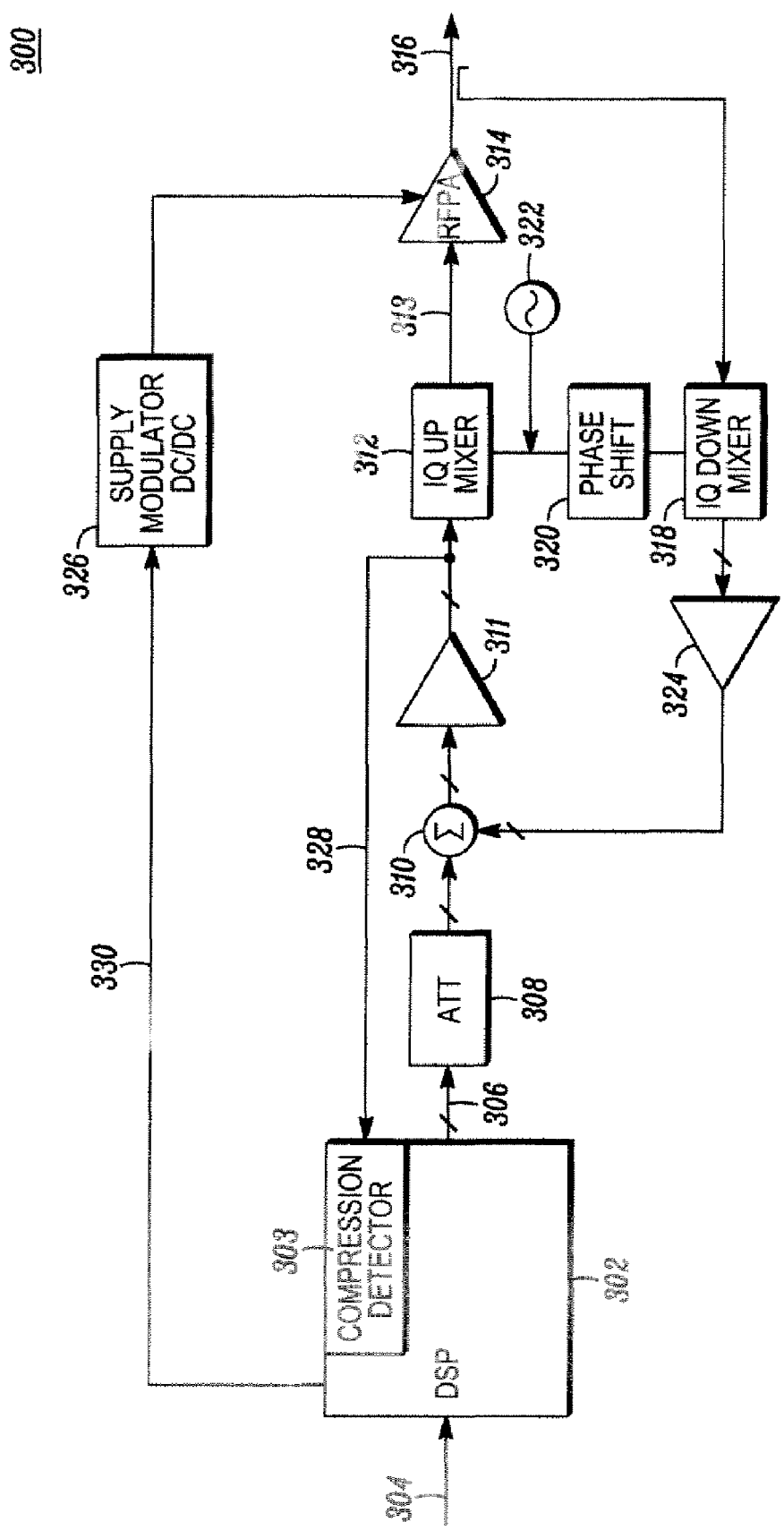
FIG. 3 is a block diagram of a transmitter with a Cartesian linear amplifier in accordance with an embodiment of the present invention.

Referring now to FIG. 3, there is shown a transmitter 300 in accordance with an embodiment of the invention. The transmitter here is provided with a digital signal processor (DSP) or microprocessor 302. The DSP 302 includes a program for implementing a compression detection function 303. The compression detection function 303 receives signals from a single point in transmitter 300 over line 328. The DSP 302 receives a signal 304 to be transmitted. This signal may be an analog or digital sampled signal. In one embodiment, the DSP generates reference I and Q quadrature baseband signals on line 306. The reference I and Q baseband signals may be attenuated by an attenuator 308, which may be a passive or active attenuator, and may be implemented in the DSP block. The attenuated reference baseband signals are fed to a summer 310, which sums the baseband signals from the DSP with baseband signals from a feed back loop. The summed baseband signals are amplified by a first baseband amplifier 311, and then fed to a modulator such as an IQ up mixer 312, which creates a low power RF signal according to a modulation scheme. The low level RF signal is provided to an RFPA 314 on line 313. The RFPA amplifies the signal for transmission, and feeds the amplified signal on line 316 to an antenna, or another transmission medium.

The transmitter shown in FIG. 3 uses feedback to linearize the signal to be transmitted. In one embodiment Cartesian feedback is utilized. To provide Cartesian feedback, the output of the RFPA is sampled by an IQ down mixer 318. The down mixer obtains quadrature signals I' and Q' from the output of the RFPA, and feeds them to a second baseband amplifier 324. The up and down mixers may share a local oscillator 322, with the oscillator signal being phase shifted by a phase shifter 320 before being supplied to the down mixer 318. The phase shifter 320 may be adjusted so that the signal from second baseband amplifier 324 is substantially out of phase with the signal from attenuator 308. The I' and Q' signals are amplified and fed back to the summer 310 where they are summed with the I and Q signals. The RFPA power supply level is modulated by a supply modulator 326, such as a fast acting DC to DC converter. Such converters are known in the art, and provide an output corresponding to a reference signal, such as a signal provided by the DSP on line 330. Although compression detector 303 is shown in FIG. 3 as a part of DSP 302, the compression detector may be in a processor separate from DSP 302. Computation resources may determine where compression detector 308 is implemented.

In accordance with this embodiment of the present invention, the supply voltage to amplifier 314 may be adjusted. More, specifically, DSP 302 controls supply modulator 326 in order to deliver and adjust a voltage to amplifier 314. The output from processor 302 on line 330 may be a DC level, or for optimum efficiency, it may be an envelope modulated signal, which corresponds to signal 207 in FIG. 2. In the case where the signal on line 330 is a DC level, the output from supply modulator 326 will be a constant voltage. The adjustment to the supply voltage is determined based on a signal parameter from compression detector 303, which detects a signal 328 in transmitter 300. The signal parameter detected is, in one embodiment, the peak-to-average power ratio. This parameter is compared with at least one predetermined limit to generate a comparison result. The comparison result is used by processor 302 to determine a signal provided to supply modulator 326. Supply modulator 326 adjusts the power supply voltage provided to power amplifier 314 based on the output from processor 302.

Figure 4:
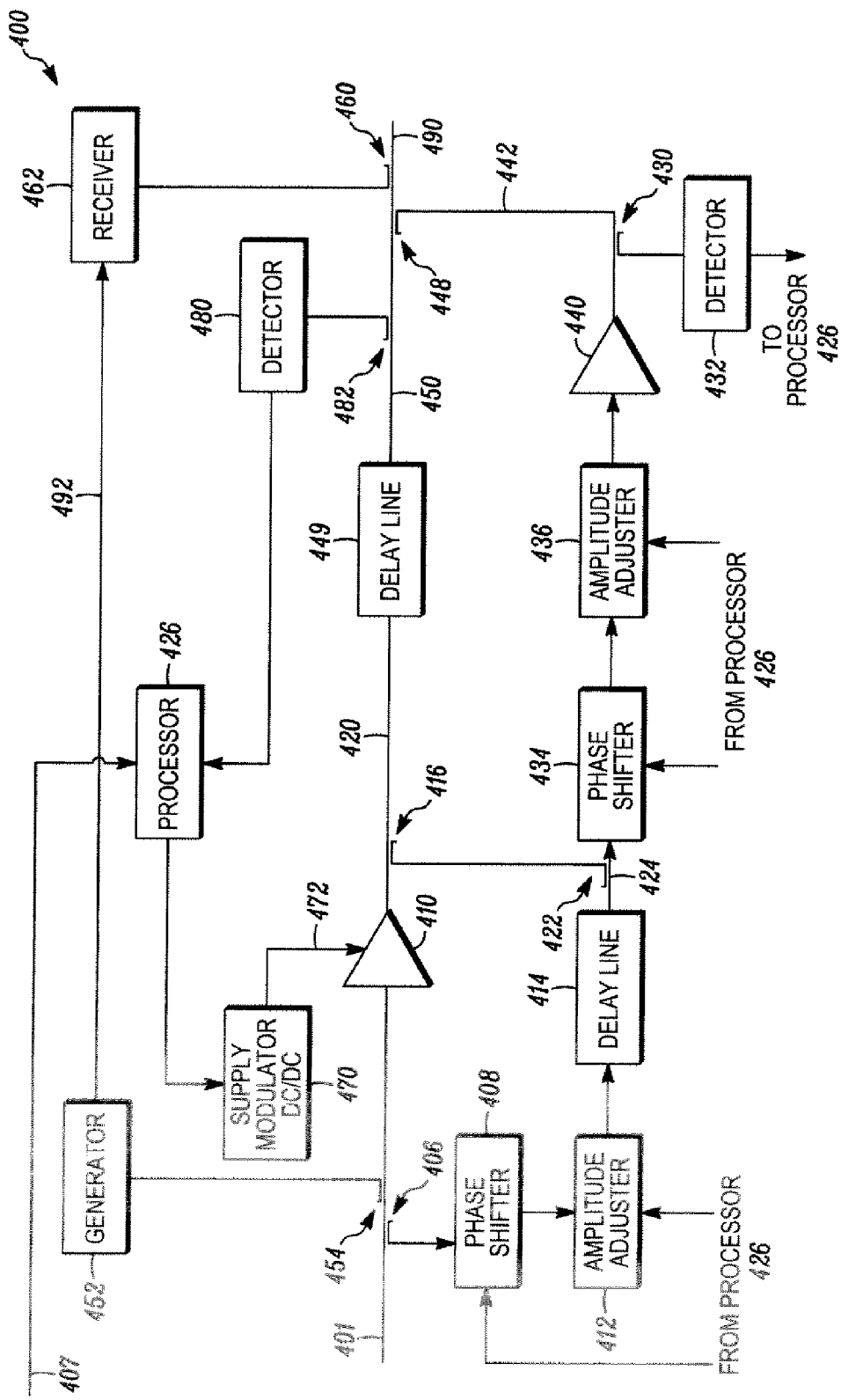
FIG. 4 is a block diagram of a transmitter with a feedforward amplifier in accordance with an embodiment of the present invention.

Referring now to FIG. 4, a feed forward transmitter 400 with power supply modulation in accordance with an embodiment of the present invention is shown. A signal 401 is amplified by a radio frequency (RF) amplifier 410, also referred to as the main amplifier. The output of amplifier 410 is a signal 420, also referred to as the main path signal. The main path signal 420 is an amplified version of signal 401. Due to amplification by amplifier 410, the main path signal 420 also contains distortion products that are not present on signal 401. This is due to the linearity limitations of amplifier 410.

A portion of signal 401 is coupled off at a coupler 406 to create a reproduction of signal 401, with the exception that this signal is smaller in amplitude. The signal from coupler 406 is provided to a phase shifter 408, an amplitude adjuster 412 and a delay line 414, in sequence. A small portion of signal 420 is then coupled off at a coupler 416, and summed with the output of delay line 414 at a coupler 422. This signal summing creates an error signal 424. The remainder of signal 420 is delayed by a delay line 449 to produce a delayed main path signal 450.

When phase shifter 408 and amplitude adjuster 412 are optimized by a microprocessor 426, error signal 424 should contain only a representation of the distortion products created by amplifier 410. This process is known as carrier cancellation (i.e., the carrier is cancelled leaving only the distortion or error products). Delay line 414 is optimized to equal the electrical delay of amplifier 410 (minus any delays in phase shifter 408 and amplitude adjuster 412) to maximize the bandwidth (BW) of the carrier cancellation.

The portion of signal 420 from coupler 416 should arrive at coupler 422. There it is coupled with a signal at the output of delay line 414 that is equal in amplitude, but 180 degrees out of phase. Maximum cancellation is realized when the root mean square (RMS) power sampled at a coupler 430 and detected by a detector 432 is at a minimum.

The error signal 424, is provided to a phase shifter 434 and an amplitude adjuster 436, prior to being amplified by a radio frequency (RF) amplifier 440, also known as the error amplifier. Amplifier 440 creates an amplified error signal 442. Amplified error signal 442 is then summed with delayed main path signal 450 via a coupler 448. The summation of these signals creates a signal 490.

When phase shifter 434 and amplitude adjuster 436 are optimized by microprocessor 426, signal 490 should contain only a larger amplitude representation of the input signal 401. This process is known as inter-modulation cancellation IMD-C (ie. the inter-modulation distortion or error products are cancelled leaving only the carrier). Delay line 449 is optimized to equal the electrical delay of amplifier 440 (including any delays in phase shifter 434 and amplitude adjuster 436) to maximize the IMD-C bandwidth.

A generator 452 and a receiver 462 are used to optimize operation of transmitter 400. Generator 452 injects a pilot tone via a coupler 454 that is amplified by main amplifier 410. It is important to minimize the pilot tone signal that gets launched into coupler 406. Any part of the pilot tone signal that makes its way to coupler 406 is due to the directivity limitations of couplers 454 and 406.

The cancellation of the IMD products is optimized when a portion of the pilot tone signal delivered via a coupler 460 to receiver 462 is at a relative minimum. When phase shifter 434 and amplitude adjuster 436 are being manipulated, for example, by processor 426 for optimization, phase shifter 408 and amplitude adjuster 412 are left in a static state.

Ideally, the amplified error signal 442 should arrive at coupler 448, and be coupled with signal 450, which is equal in error signal amplitude, but 180 degrees out of phase, yielding an output signal 490 which is substantially free of IMD products.

For improved IMD-C in the frequency band of interest, generator 452 can sweep the pilot tone signal across the usable spectrum of the main amplifier. The receiver 462 is then tuned via a steering signal 492, from generator 452, to the correct portion of the spectrum to receive the pilot tone signal.

A supply voltage 472, which is determined by a power supply modulator (PSM) 470, supplies DC power to main amplifier 410. In accordance with one embodiment of the present invention, the supply voltage may be adjusted. More, specifically, processor 426 controls PSM 470 in order to deliver and adjust a voltage 472. The output from processor 426 may be a DC level, or for optimum efficiency, it may be a scaled version of an envelope modulation signal 407, which corresponds to signal 207 in FIG. 2. In the case where the output from processor 426 is a DC level, the output from PSM 470 will be a constant voltage. In one embodiment the adjustment to voltage 472 is determined based on a signal parameter from a detector 432. In another embodiment, the adjustment to voltage 472 is determined based on a signal parameter from a detector 480. Detectors 432 and 480 each receive and detect a signal via couplers 430 and 482, respectively. The processor 426 then determines a signal parameter based on the signal detected. The signal parameter is compared to at least one predetermined limit to generate a comparison result. The comparison result is used to determine whether to adjust the supply voltage to the amplifier 410. In the embodiment employing detector 432, the signal parameter is an average power. In the embodiment employing detector 480, the signal parameter is a peak-to-average power ratio. When adjusting the supply voltage as described above, the phase shifters 434, 408 and the amplitude adjusters 436, 412 are left in a static state.

While detector 432 is shown in FIG. 4 with its coupler 430 at the output of error amplifier 440, detector 432 may alternatively be placed with its coupler at the input to error amplifier 440.

Figure 5:
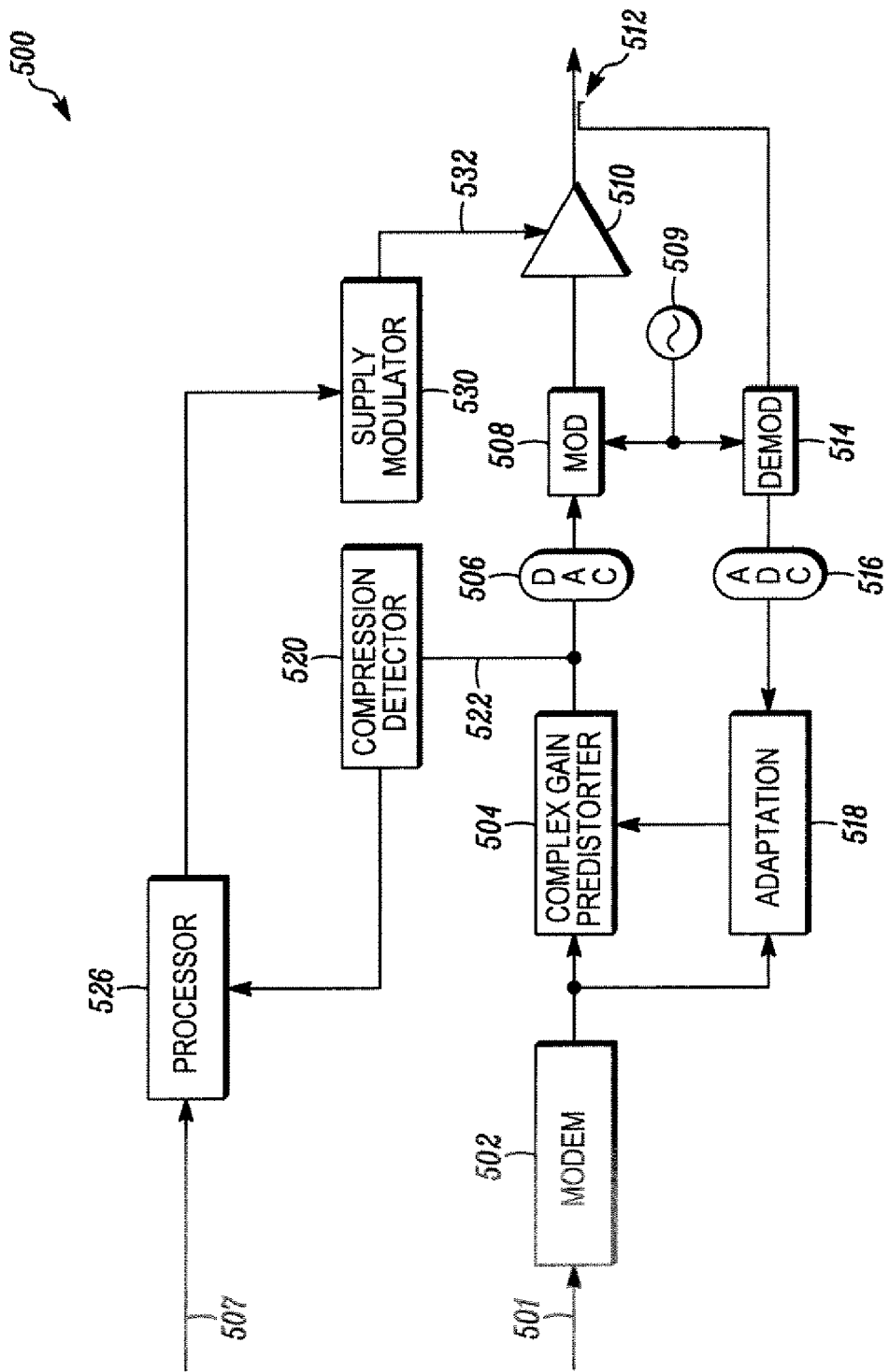
FIG. 5 is a block diagram of a transmitter with a digital predistortion amplifier in accordance with an embodiment of the present invention.

FIG. 5 shows a block diagram of an transmitter 500 with adaptive digital predistortion and power supply modulation in accordance with an embodiment of the present invention. In transmitter 500, predistortion is used to compensate for nonlinear distortions. The predistortion is made adaptive based on a difference between the desired modulation and the power amplifier's output.

A modem 502 processes an input signal 501, which is for example, voice signals. Modem 502 is a DSP or other processor or circuitry for processing the input signal. The signal that is output from modem 502 is provided to a complex gain predistorter 504. The complex gain predistorter 504 applies a predistortion function to the signal before providing the signal to a digital-to-analog converter 506. More specifically, the complex gain predistorter 504 is a nonlinear module that generates intermodulation distortion (IMD) products in antiphase with the IMD products from a power amplifier 510, theoretically removing out-of-band emissions. In one embodiment, the amount of predistortion applied by complex gain distorter is controlled by updating values in a look-up table with the interpolated amplitude modulation to amplitude modulation nonlinearities and the amplitude modulation to phase modulation nonlinearities. The analog signal produced by digital-to-analog converter 506 is provided to a modulator or up mixer 508, which modulates the signal from the digital-to-analog converter with a radio frequency signal from an oscillator 509. The radio frequency signal from modulator 508 is provided to power amplifier 510, which amplifies the signal for emission by an antenna (not shown).

A coupler 512 receives a signal emitted from the power amplifier 510 for use in feedback for the predistortion. More specifically, a demodulator or down mixer 514 receives the signal from coupler 512 and demodulates the radio frequency signal using input from oscillator 509. This demodulated signal is digitized using an analog-to-digital converter 516 to produce a digital representation of the transmitted signal. An adaptation function 518 receives the digital signal from converter 516. This signal contains, theoretically and approximately, the distortion added by the power amplifier 510. The adaptation function adjusts the look-up table entries used by complex gain predistorter 504 to cancel this distortion.

In accordance with an embodiment of the present invention, a supply voltage to amplifier 510 may be adjusted. More, specifically, a processor 526 controls a PSM 530 in order to deliver and adjust a voltage 532. The output from processor 526 may be a DC level, or for optimum efficiency, it may be a scaled version of an envelope modulation signal 507, which corresponds to signal 207 in FIG. 2. In the case where the output from processor 526 is a DC level, the output from PSM 530 will be a constant voltage. The adjustment to voltage 532 is determined based on a signal parameter from a compression detector 520, which detects a signal 522 in transmitter 500. The signal parameter detected is, in one embodiment, the peak-to-average power ratio. This parameter is compared with at least one predetermined limit to generate a comparison result. The comparison result is used by processor 526 to determine a signal provided to supply modulator 530. Supply modulator 530 adjusts the power supply voltage provided to power amplifier 510 based on the output from processor 526.

Figure 6:
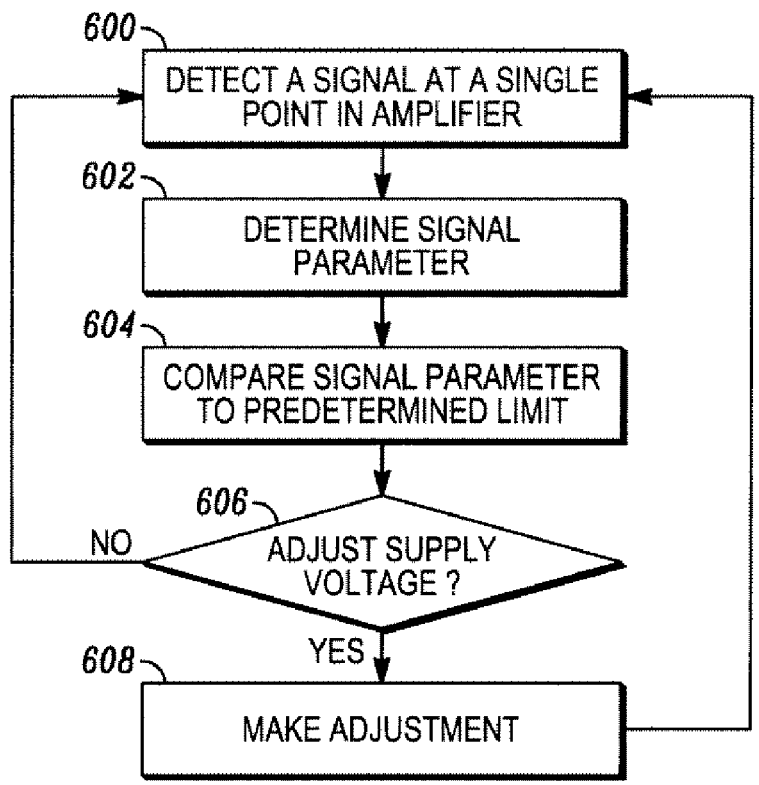
FIG. 6 is a flow diagram illustrating a method for controlling the power supply voltage to a power amplifier in accordance with an embodiment of the present invention.

FIG. 6 is a flow diagram illustrating a method for controlling a power supply voltage in accordance with an embodiment of the invention. First a signal is detected or received at a single point in a power amplifier (600). In one embodiment the signal is a digital signal with I (inphase) and Q (quadrature) pairs, and a DSP receives and detects the signal. The point for detection varies, as discussed above with respect to the embodiments shown in FIG. 3, FIG. 4 and FIG. 5. In one embodiment, the signal is detected prior to being mixed or modulated with a radio frequency signal, as shown in FIG. 3 and FIG. 5. In other embodiments, the signal is detected at an output of the power (main) amplifier or at an output or input of an error amplifier, as shown in FIG. 4. In contrast to other compression detection schemes, one point for access to a signal, rather than plural points, is all that is required.

Figure 7:
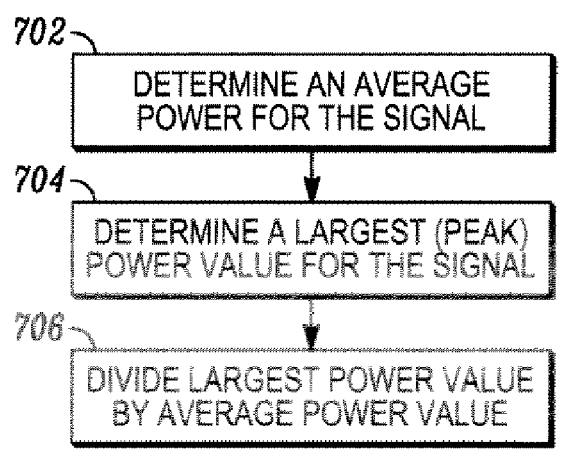
FIG. 7 is a flow diagram illustrating a method for determining a signal parameter in accordance with an embodiment of the present invention.

After the signal is detected (600), a signal parameter is determined (602). Typically, the signal is sampled (e.g., digitally sampled) for a predetermined period of time, for example, from a beginning measurement point to an end measurement point, or a predetermined number of samples of a signal are collected. In one embodiment, 100,000 to 1,000,000 samples of the signal are collected for use in determining the signal parameter. The signal parameter is alternatively an average power, a peak-to-average power ratio, or a combination or function of one or more of these. FIG. 7, discussed later, illustrates an embodiment for determining an average power and a peak-to-average power ratio as the signal parameter.

Once the signal parameter is determined (602), the signal parameter is compared to at least one predetermined limit (604). For example, where the signal parameter is a peak-to-average power ratio, the peak-to-average power ratio is compared to a predetermined peak-to-average power ratio value. In the embodiments shown in FIG. 3 and FIG. 5, if the peak-to-average power ratio is larger than the predetermined limit, then the supply voltage to the power amplifier is increased in order to reduce power amplifier compression at peak power levels. On the other hand, for the embodiments in FIG. 3 and FIG. 5, if the peak-to-average power ratio is at or below the predetermined level, then the supply voltage to the power amplifier is reduced in order to make the power amplifier operate more efficiently.

As an alternative to using one peak-to-average power ratio value for the predetermined limit, two predetermined limits may be used: an upper limit and a lower limit. The lower limit is lower than the upper limit. In this case, for the embodiments shown in FIG. 3 and FIG. 5, the upper limit is compared to the determined peak-to-average power ratio and the supply voltage is increased (606, 608), if the peak-to-average power ratio is greater than the upper limit. For the embodiments shown in FIG. 3 and FIG. 5, if the peak-to-average power ratio is below the lower limit, then the supply voltage is reduced (606, 608)). If the peak-to-average power ratio is between the upper limit and the lower limit, then no change is made to the supply voltage to the power amplifier (606).

For the embodiment shown in FIG. 4, where the signal parameter is a peak-to-average power ratio and one predetermined limit is defined, if the determined peak-to-average power ratio is higher than the predetermined limit, then the supply voltage to the power amplifier is decreased in order to make the power amplifier operate more efficiently. Conversely, where the signal parameter is a peak-to-average power ratio and one predetermined limit is defined, if the peak-to-average power ratio is below the predetermined limit, then the supply voltage is increased in order to reduce power amplifier compression at peak power levels. This is the inverse of the action taken with respect to the embodiments in FIG. 3 and FIG. 5, as discussed above.

For the embodiment shown in FIG. 4, if upper and lower limits are defined and the signal parameter is a peak-to-average power ratio, if the peak-to-average power ratio is greater than the upper limit, then the power supply voltage to the power amplifier is reduced. For this case, if the peak-to-average power ratio is lower than the lower limit, then the power supply voltage to the power amplifier is increased. And, where the peak-to-average power ratio is between an upper limit and a lower limit, no change is made to the supply voltage to the power amplifier.

If the signal parameter is the average power level, rather than the peak-to-average power ratio, then the predetermined limit(s) is an average power value. For the embodiment in FIG. 4, where there is one predetermined limit, the supply voltage may be increased if the average power exceeds the predetermined limit and decreased if the average power is below the predetermined limit (606, 608). And analogously, where there are two predetermined limits, an upper limit and a lower limit, the supply voltage may be increased if the average power is above the upper limit (606, 608), unchanged if the average power is between the upper and lower limit (606), and reduced if the average power is below the lower limit (606, 608).

In the case of peak-to-average power detection, the predetermined limits may be based on the peak-to-average power of an ideal, undistorted signal. In some cases the peak-to-average power limits may be calculated; however, in most cases, the peak-to-average power limits are determined by doing a statistical analysis on some or all signals that might be generated by any arbitrary input signal.

In the case of average power detection, the predetermined limits are experimentally determined based each power amplifier design. These limits may also be a function of amplifier output power.

FIG. 7 is a flow diagram illustrating a method for determining a signal parameter (602) in accordance with an embodiment of the present invention. First, an average power is determined for the signal (702). In one embodiment this is accomplished by a processor determining and adding the power for each sample (e.g., digital sample) of the signal and dividing that number by the total number of samples (e.g., from a beginning measurement point to an end measurement point). The power is determined by squaring I, squaring Q, and adding the results (Power=$I^2+Q^2$). Where the signal parameter is average power, no further determination need be made. On the other hand, if the signal parameter is the peak-to-average power ratio, then further steps are required, as discussed below.

After the average power is determined (702), then a peak (largest) power value is determined. In one embodiment, the peak power value is the power of the sample of the signal that has the largest power value as compared to the remaining samples under consideration. This is accomplished by comparing the power values for each sample of the signal and determining which of those values is the absolute largest.

To determine the peak-to-average ratio, the peak or largest power value is divided by the average power value (706).

According to the embodiments of the invention described herein, a single point in a transmitter is monitored to determine whether to adjust a power supply voltage to a power amplifier. This advantageously reduces a number of access points necessary for adjusting the power supply voltage. In addition, the computation needed to determine whether to adjust a supply voltage to a power amplifier is reduced in light of the steps needed to compare a signal parameter of a signal from the single monitoring point to at least one predetermined limit.

In the foregoing specification, specific embodiments of the present invention are described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The invention claimed is:

1. A method for controlling a supply voltage to a power amplifier comprising the steps of:
    detecting a signal at a single point in an input path of a power amplifier to produce a detected signal;
    determining a peak-to-average power ratio based on the detected signal;
    comparing the peak-to-average power ratio to a first predetermined peak-to-average power ratio value and a second predetermined peak-to-average power ratio value that is lower than the first predetermined peak-to-average power ratio value to generate a comparison result that indicates a level of compression in the power amplifier;
    increasing the supply voltage when the peak-to-average power ratio is above the first predetermined peak-to-average power ratio value; and
    reducing the supply voltage when the peak-to-average power ratio is below the second predetermined peak-to-average power ratio value.

2. The method of claim 1 wherein the peak-to-average power ratio is determined by:
    determining an average power for the signal;
    determining a largest power value for the signal; and
    dividing the largest power value by the average power.

3. The method of claim 1, wherein the supply voltage comprises one of:
    a constant voltage; and
    a voltage generated by a power supply modulator.

4. The method of claim 1 wherein the signal is a plurality of digitized samples received from a beginning measurement point to an end measurement point; and
the step of determining the peak-to-average power ratio includes the steps of:
    determining a power for each digitized sample of the plurality of digitized samples;
    determining a total number of digitized samples from the beginning measurement point to the end measurement point;
    summing the power for each digitized sample of the plurality of digitized samples to produce a total power;
    determining a largest power value for a digitized sample of the plurality of digitized samples;

determining an average power by dividing the total power by the total number of digitized samples;

determining the peak-to-average power ratio by dividing the largest power value by the average power.

5. The method of claim 1 wherein if the peak-to-average power ratio is within the first predetermined peak-to-average power ratio value and the second predetermined peak-to-average power ratio value, then leaving the supply voltage at a current value.

6. The method of claim 1 wherein the power amplifier is one of a Cartesian linear power amplifier or a predistortion linear power amplifier.

7. An apparatus for controlling a supply voltage to a power amplifier comprising:

a power amplifier; and a processor coupled to the power amplifier that:

detects a signal at a single point in an input path of the power amplifier to produce a detected signal;

determines a peak-to-average power ratio based on the detected signal;

compares the peak-to-average power ratio to a first predetermined peak-to-average power ratio value and a second predetermined peak-to-average power ratio value that is lower than the first predetermined peak-to-average power ratio value to generate a comparison result that indicates a level of compression in the power amplifier;

causes an increase in the supply voltage when the peak-to-average power ratio is above the first predetermined peak-to-average power ratio value; and causes a reduction in the supply voltage when the peak-to-average power ratio is below the second predetermined peak-to-average power ratio value.

8. The apparatus of claim 7 wherein the peak-to-average power ratio is determined by:

determining an average power for the signal;

determining a largest power value for the signal; and dividing the largest power value by the average power.

9. The apparatus of claim 7 wherein the signal is a plurality of digitized samples received from a beginning measurement point to an end measurement point; and the peak-to-average power ratio is determined by the processor:

determining a power for each digitized sample of the plurality of digitized samples;

determining a total number of digitized samples from the beginning measurement point to the end measurement point;

summing the power for each digitized sample of the plurality of digitized samples to produce a total power;

determining a largest power value for a digitized sample of the plurality of digitized samples;

determining an average power by dividing the total power by the total number of digitized samples;

determining the peak-to-average power ratio by dividing the largest power value by the average power.

10. A method for controlling a supply voltage to a power amplifier comprising the steps of:

detecting a signal at a single point in a power amplifier to produce a detected signal;

determining an average power level based on the detected signal;

comparing the average power level to a first predetermined average power value and a second predetermined average power value that is lower than the first predetermined average power value to generate a comparison result that indicates a level of compression in the power amplifier;

increasing the supply voltage when the average power level is above the first predetermined average power value; and reducing the supply voltage when the average power level is below the second predetermined average power value.

11. The method of claim 10, wherein detecting the signal at the single point in the power amplifier comprises detecting the signal at an input path of an error amplifier in a feed forward amplifier.

12. The method of claim 10, wherein detecting the signal at the single point in the power amplifier comprises detecting the signal at an output path of an error amplifier in a feed forward amplifier.

* * * * *